(12) United States Patent
Oganesian et al.

(10) Patent No.: US 9,461,190 B2
(45) Date of Patent: Oct. 4, 2016

(54) LOW PROFILE SENSOR PACKAGE WITH COOLING FEATURE AND METHOD OF MAKING SAME

(71) Applicant: Optiz, Inc., Palo Alto, CA (US)

(72) Inventors: Vage Oganesian, Sunnyvale, CA (US); Zhenhua Lu, East Palo Alto, CA (US)

(73) Assignee: OPTIZ, INC., Palo Alto, CA (US)

( * ) Notice: Subject to any disclaimer, the term of this patent is extended or adjusted under 35 U.S.C. 154(b) by 0 days.

(21) Appl. No.: 14/492,219

(22) Filed: Sep. 22, 2014

(65) Prior Publication Data

US 2015/0084148 A1    Mar. 26, 2015

Related U.S. Application Data

(60) Provisional application No. 61/881,520, filed on Sep. 24, 2013.

(51) Int. Cl.
*H01L 31/0203*  (2014.01)
*H01L 31/024*  (2014.01)
*H01L 31/02*  (2006.01)
*H01L 27/146*  (2006.01)

(52) U.S. Cl.
CPC ....... *H01L 31/024* (2013.01); *H01L 27/14618* (2013.01); *H01L 27/14636* (2013.01); *H01L 31/02005* (2013.01); *H01L 2224/16225* (2013.01); *H01L 2224/32225* (2013.01); *H01L 2224/48091* (2013.01); *H01L 2224/73204* (2013.01); *H01L 2224/73253* (2013.01)

(58) Field of Classification Search
CPC .................... H01L 31/0203; H01L 27/14618; H01L 2924/1079

USPC ................ 257/432, 433, 444, 706, 712, 713
See application file for complete search history.

(56) References Cited

U.S. PATENT DOCUMENTS

| 6,627,864 B1 | 9/2003 | Glenn |
| 6,777,767 B2 | 8/2004 | Badehi |
| 6,972,480 B2 | 12/2005 | Zilber et al. |
| 7,033,664 B2 | 4/2006 | Zilber et al. |
| 7,157,742 B2 | 1/2007 | Badehi |
| 7,192,796 B2 | 3/2007 | Zilber et al. |
| 7,265,440 B2 | 9/2007 | Zilber et al. |

(Continued)

FOREIGN PATENT DOCUMENTS

| KR | 1020090102208 | 9/2009 |
| KR | 1020100011648 | 2/2010 |
| KR | 1020130083846 | 7/2013 |

OTHER PUBLICATIONS

U.S. Appl. No. 13/157,193, filed Jun. 9, 2011, Oganesian, Vage.

(Continued)

*Primary Examiner* — Quoc Hoang
(74) *Attorney, Agent, or Firm* — DLA Piper LLP (US)

(57) ABSTRACT

A sensor device and method of making same that includes a silicon substrate with opposing first and second surfaces, a sensor formed at or in the first surface, a plurality of first contact pads formed at the first surface which are electrically coupled to the sensor, and a plurality of cooling channels formed as first trenches extending into the second surface but not reaching the first surface. The cooling channels instead can be formed on one or more separate substrates that are attached to the silicon substrate for cooling the silicon substrate.

12 Claims, 16 Drawing Sheets

(56) References Cited

U.S. PATENT DOCUMENTS

| | | |
|---|---|---|
| 7,456,901 B2 | 11/2008 | Jeong et al. |
| 7,495,341 B2 | 2/2009 | Zilber et al. |
| 7,569,409 B2 | 8/2009 | Lin et al. |
| 7,589,422 B2 | 9/2009 | Lee et al. |
| 7,642,629 B2 | 1/2010 | Zilber et al. |
| 7,664,390 B2 | 2/2010 | Cho et al. |
| 7,859,033 B2 | 12/2010 | Brady |
| 8,164,177 B2 * | 4/2012 | Matz et al. ............... 257/703 |
| 8,183,579 B2 * | 5/2012 | Wang ........................ 257/79 |
| 8,432,011 B1 | 4/2013 | Oganesian |
| 8,772,919 B2 | 7/2014 | Chien et al. |
| 2004/0251525 A1 | 12/2004 | Zilber |
| 2005/0051859 A1 | 3/2005 | Hoffman |
| 2005/0104179 A1 | 5/2005 | Zilber |
| 2005/0104186 A1 | 5/2005 | Yang |
| 2005/0205977 A1 | 9/2005 | Zilber |
| 2007/0138498 A1 | 6/2007 | Zilber |
| 2007/0190691 A1 | 8/2007 | Humpston |
| 2007/0190747 A1 | 8/2007 | Humpston |
| 2008/0012115 A1 | 1/2008 | Zilber |
| 2008/0017879 A1 | 1/2008 | Zilber |
| 2008/0083976 A1 | 4/2008 | Haba |
| 2008/0083977 A1 | 4/2008 | Haba |
| 2008/0099900 A1 | 5/2008 | Oganesian |
| 2008/0099907 A1 | 5/2008 | Oganesian |
| 2008/0116544 A1 | 5/2008 | Grinman |
| 2008/0116545 A1 | 5/2008 | Grinman |
| 2008/0150121 A1 | 6/2008 | Oganesian |
| 2008/0246136 A1 | 10/2008 | Haba |
| 2008/0265350 A1 | 10/2008 | Wu et al. |
| 2009/0115047 A1 | 5/2009 | Haba |
| 2009/0160065 A1 | 6/2009 | Haba |
| 2009/0212381 A1 | 8/2009 | Crisp |
| 2010/0053407 A1 | 3/2010 | Crisp |
| 2010/0225006 A1 | 9/2010 | Haba |
| 2010/0230812 A1 | 9/2010 | Oganesian |
| 2010/0237452 A1 | 9/2010 | Hagiwara et al. |
| 2011/0012259 A1 | 1/2011 | Grinman |
| 2011/0031629 A1 | 2/2011 | Haba |
| 2011/0033979 A1 | 2/2011 | Haba |
| 2011/0049696 A1 | 3/2011 | Haba |
| 2011/0108940 A1 | 5/2011 | Huang et al. |
| 2011/0187007 A1 | 8/2011 | Haba |
| 2011/0193210 A1 | 8/2011 | Chien et al. |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0043635 A1 | 2/2012 | Yang |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |

OTHER PUBLICATIONS

U.S. Appl. No. 13/157,202, filed Jun. 9, 2011, Oganesian, Vage.
U.S. Appl. No. 13/157,207, filed Jun. 9, 2011, Oganesian, Vage.
U.S. Appl. No. 13/186,357, filed Jul. 19, 2011, Oganesian, Vage.
U.S. Appl. No. 13/225,092, filed Sep. 2, 2011, Oganesian, Vage.
U.S. Appl. No. 13/301,683, filed Nov. 21, 2011, Oganesian, Vage.
U.S. Appl. No. 13/343,682, filed Jan. 4, 2012, Oganesian, Vage.
U.S. Appl. No. 13/427,604, filed Mar. 22, 2012, Oganesian, Vage.
U.S. Appl. No. 13/356,328, filed Jan. 23, 2012, Oganesian, Vage.
U.S. Appl. No. 13/468,632, filed May 10, 2012, Oganesian, Vage.
U.S. Appl. No. 13/559,510, filed Jul. 26, 2012, Oganesian, Vage.
U.S. Appl. No. 13/423,045, filed Mar. 16, 2012, Oganesian, Vage.
U.S. Appl. No. 13/609,002, filed Sep. 10, 2012, Oganesian, Vage.
U.S. Appl. No. 13/312,826, filed Dec. 2011, Oganesian.

* cited by examiner

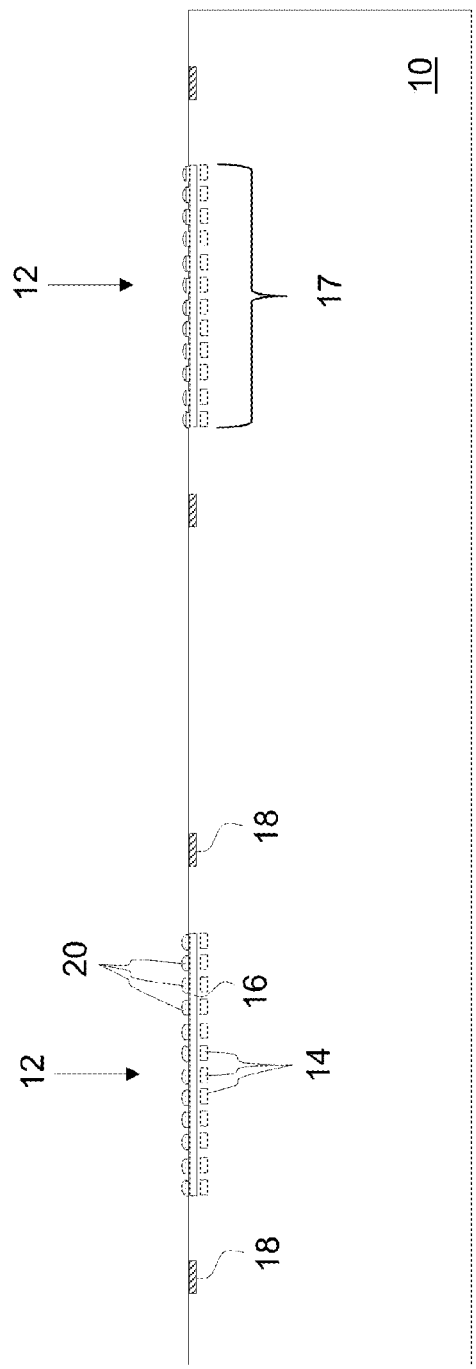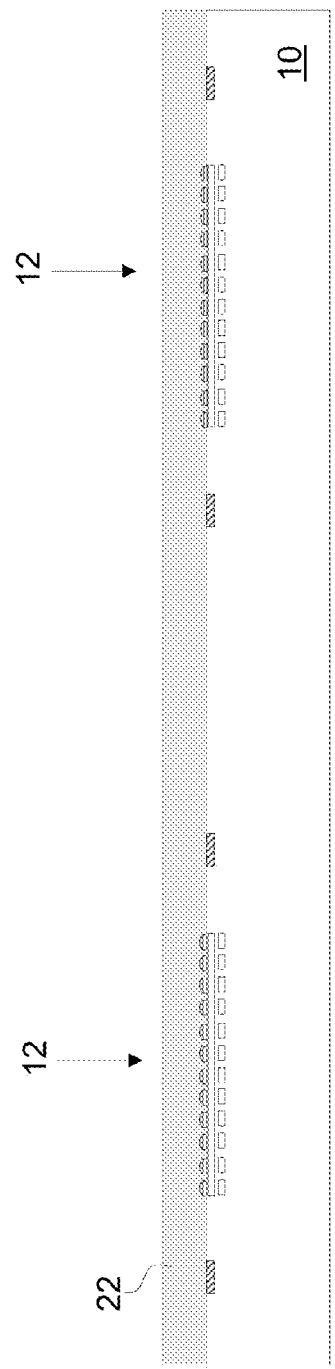

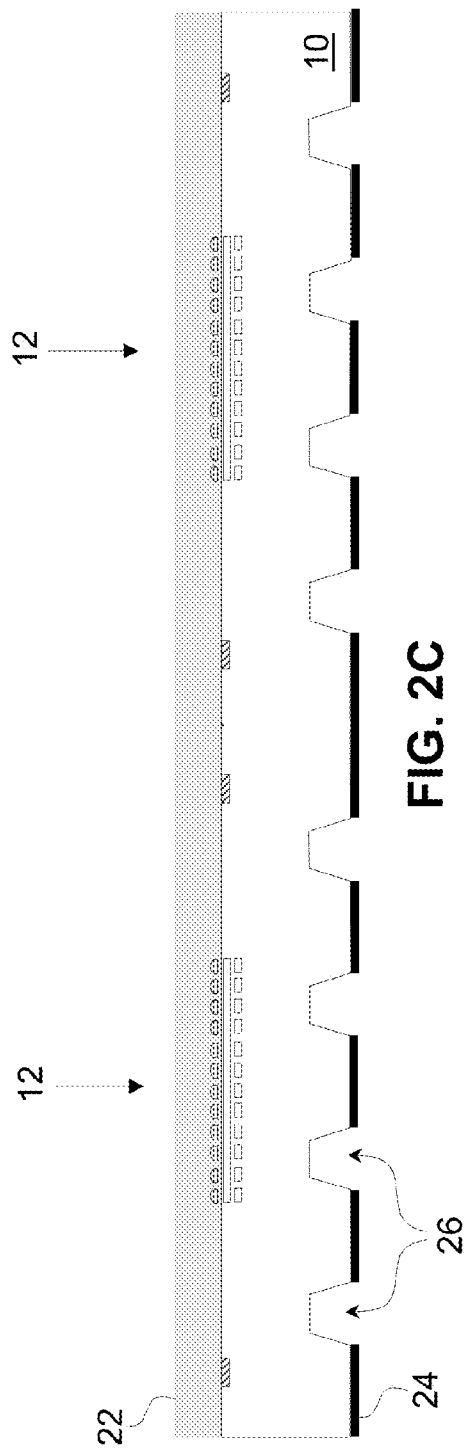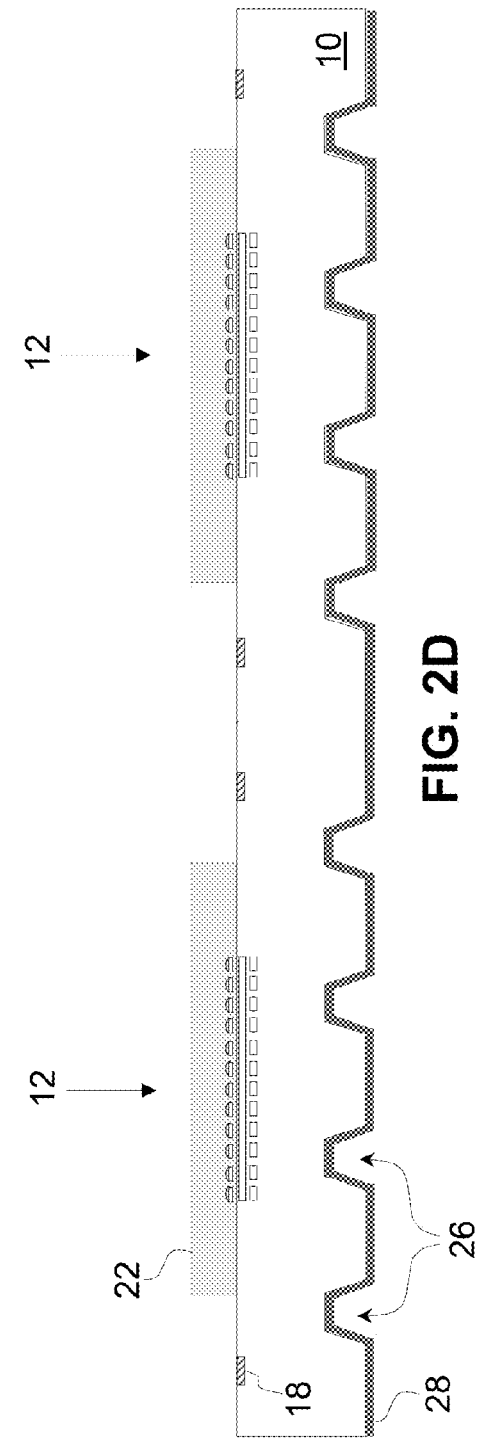

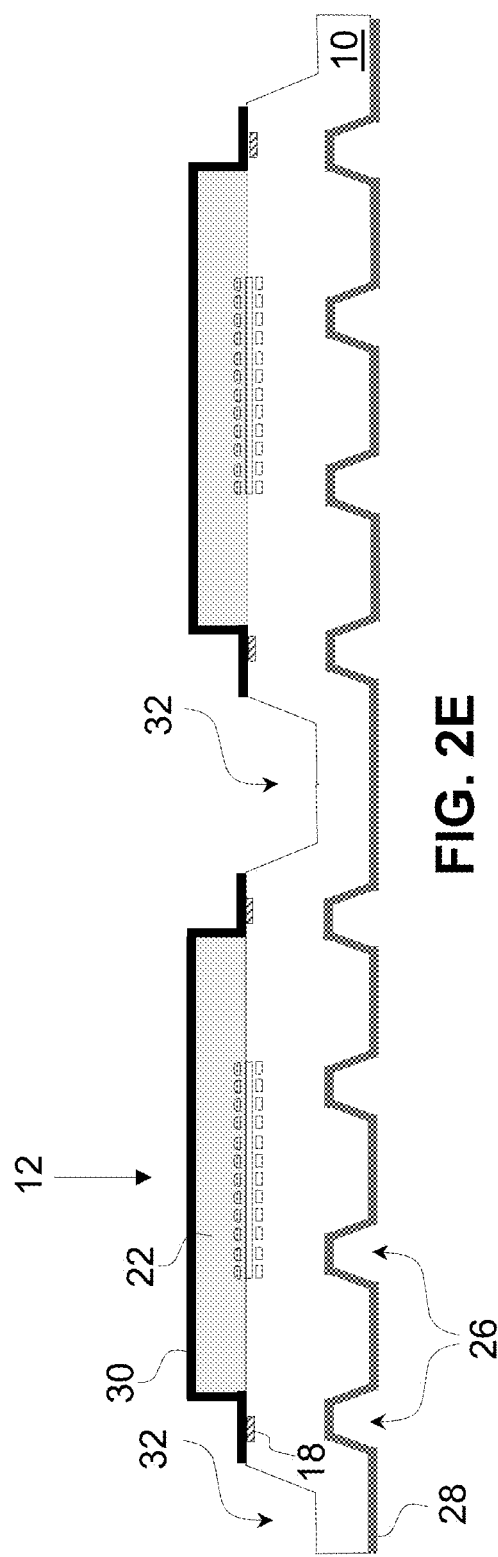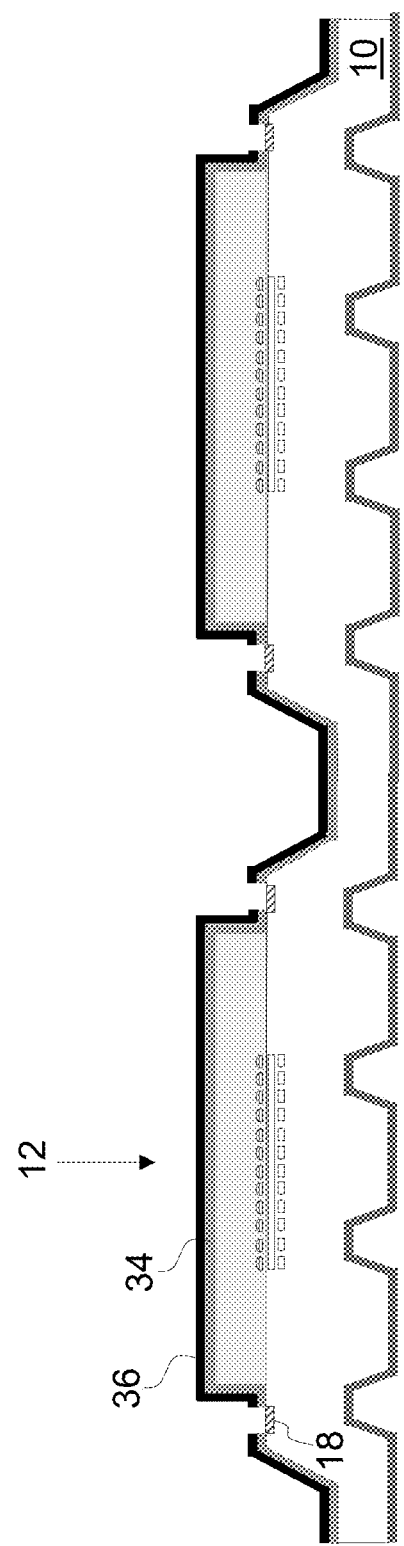

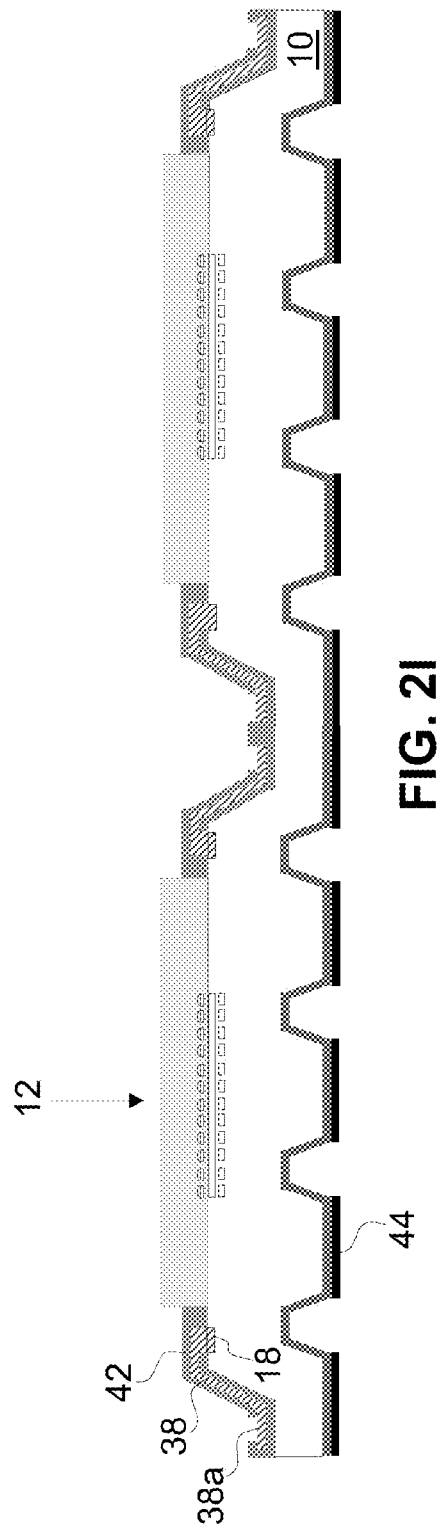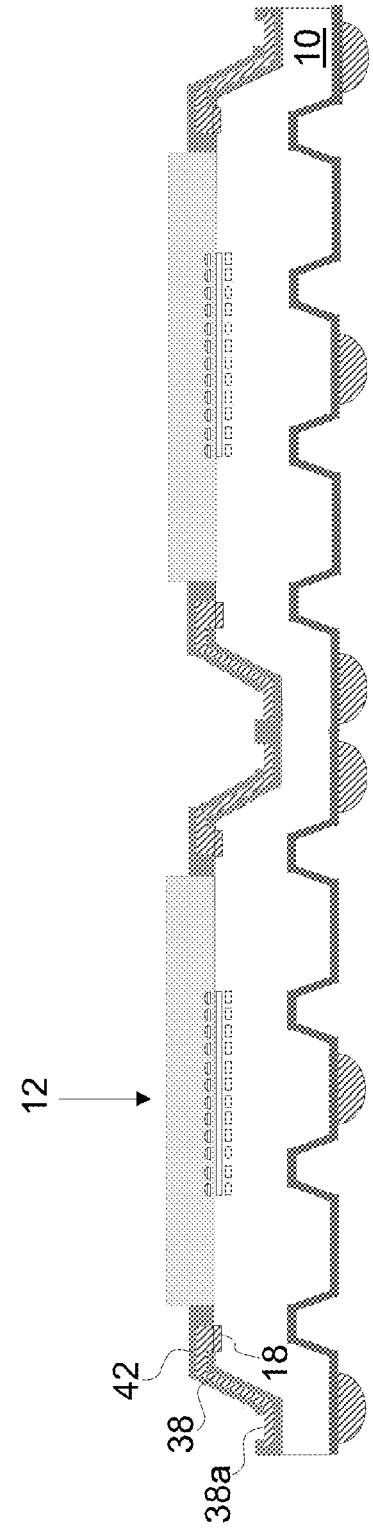

LOW PROFILE SENSOR PACKAGE WITH COOLING FEATURE AND METHOD OF MAKING SAME

RELATED APPLICATIONS

This application claims the benefit of U.S. Provisional Application No. 61/881,520, filed Sep. 24, 2013, and which is incorporated herein by reference.

FIELD OF THE INVENTION

The present invention relates to packaging of microelectronic sensor devices, and more particularly to the cooling of sensor devices while maintaining a compact structure.

BACKGROUND OF THE INVENTION

Conventional chip cooling configurations are shown in FIGS. 1A and 1B. The configurations include one or more semiconductor devices (chips) 1 mounted (by its bottom surface) to a host (package) substrate 2 such as silicon. A large heat sink 3 is mounted to the top of the chip 1, for conducting and dissipating heat into the air via the fins 4 of the heat sink 3. There are several drawbacks to the conventional chip cooling configuration. First, the thickness of the packaged assembly is too large. Second, the surface area of the chip in contact with heat sink is too small, which results in a heat dissipation rate off the chip that is too low. Third, for chips that have active areas that need to be exposed (e.g. image sensors), a tradition heat sink cannot be applied over the active area.

There is a need for a chip cooling configuration that is compatible with chips with exposed active areas, yet adds minimal thickness to the overall size.

BRIEF SUMMARY OF THE INVENTION

A sensor device that includes a silicon substrate with opposing first and second surfaces, a sensor formed at or in the first surface, a plurality of first contact pads formed at the first surface which are electrically coupled to the sensor, and a plurality of cooling channels formed as first trenches extending into the second surface but not reaching the first surface.

A sensor device that includes a silicon substrate with opposing first and second surfaces, a sensor formed at or in the first surface, a plurality of first contact pads formed at the first surface which are electrically coupled to the sensor, a second substrate with opposing first and second surfaces, wherein the second surface of the silicon substrate is mounted to the first surface of the second substrate, and a plurality of cooling channels formed as first trenches extending into one of the first and second surfaces of the second substrate but not reaching the other of the first and second surfaces of the second substrate.

A method of forming a sensor device includes providing a silicon substrate with opposing first and second surfaces, forming a sensor at or in the first surface, forming a plurality of first contact pads at the first surface which are electrically coupled to the sensor, and forming a plurality of cooling channels as first trenches extending into the second surface but not reaching the first surface.

A method of forming a sensor device includes providing a silicon substrate with opposing first and second surfaces, forming a sensor at or in the first surface, forming a plurality of first contact pads at the first surface which are electrically coupled to the sensor, providing a second substrate with opposing first and second surfaces, forming a plurality of cooling channels as first trenches extending into one of the first and second surfaces of the second substrate but not reaching the other of the first and second surfaces of the second substrate, and mounting the second surface of the silicon substrate to the first surface of the second substrate.

Other objects and features of the present invention will become apparent by a review of the specification, claims and appended figures.

BRIEF DESCRIPTION OF THE DRAWINGS

FIGS. 2A-K are side cross sectional views showing the steps in forming cooling channels in a substrate containing an image sensor.

DETAILED DESCRIPTION OF THE INVENTION

The present invention is a low profile packaging cooling solution for semiconductor chip devices.

Figure 1A:
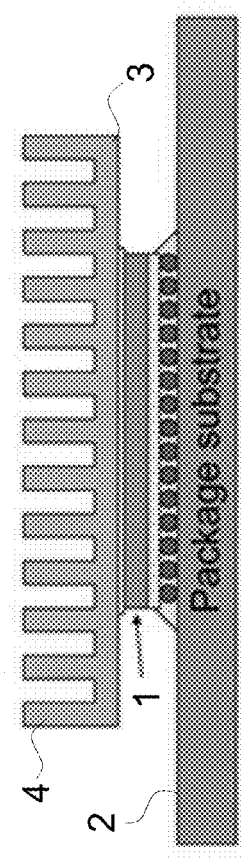
FIGS. 1A and 1B are side cross sectional views of prior art chip cooling configurations.
Figure 1B:
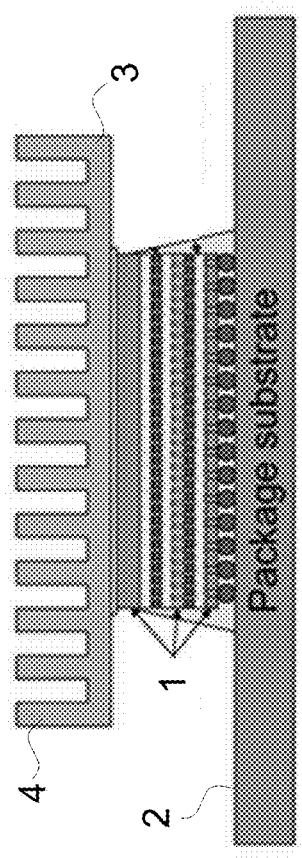
Figure 2G:
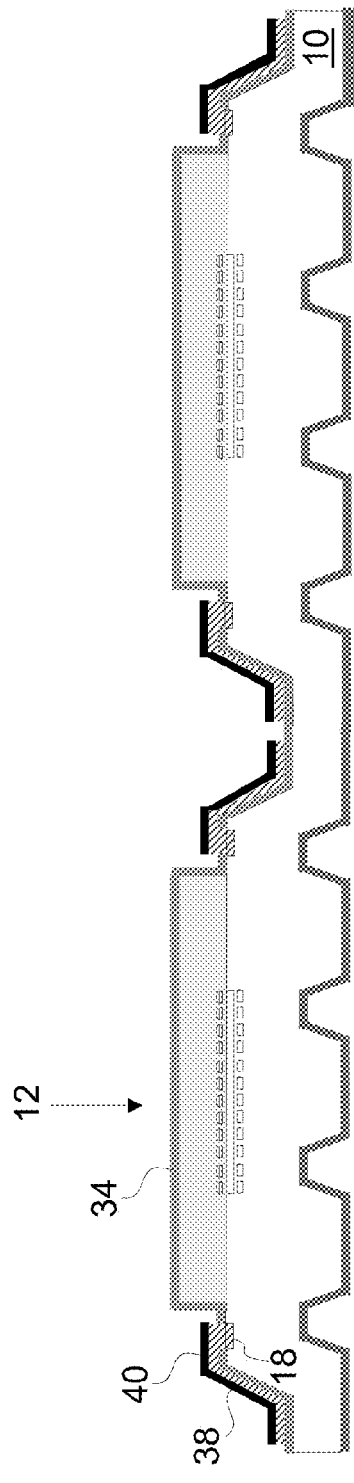

FIGS. 2A-2K illustrate the formation of the cooling package solution. The formation begins with a wafer 10 (substrate) containing multiple sensors 12 formed thereon (i.e. on, at and/or in the top/front surface of the substrate 10), as illustrated in FIG. 2A. For the purposes of illustration, the formation of the packaged sensor will be described with respect to an optical sensor, but any sensor can be used (e.g. light, chemical, fingerprint, MEMS sensors, etc.). Each image sensor 12 includes a plurality of photo detectors 14, supporting circuitry 16, and contact pads 18. Sensors 12 are configured to detect and measure light incident on the active area 17 of each sensor 12. The contact pads 18 are electrically connected to the photo detectors 14 and/or their supporting circuitry 16 for providing off chip signaling. Each photo detector 14 incoming converts light energy to a voltage signal. Additional circuitry may be included to amplify the voltage, and/or convert it to digital data. Color filters and/or microlenses 20 can be mounted over the photo detectors 14. Sensors of this type are well known in the art, and not further described herein.

A protective layer 22 such as a polymer in the form of a film is placed or deposited or mounted over the active (top/front) surface of the substrate 10. An optional silicon thinning process can be applied to the back/bottom surface of the substrate 10, for example by mechanical grinding, chemical mechanical polishing (CMP), wet etching, atmospheric downstream plasma (ADP), dry chemical etching (DCE), or a combination of aforementioned processes or any another appropriate silicon thinning method(s). The resulting structure is shown in FIG. 2B.

A layer of photoresist 24 is deposited over the back surface of the substrate 10. Photoresist deposition can be spray, spin coating or any another appropriate deposition method(s). The photoresist 24 is exposed and selectively etched using appropriate photolithography processing that is well known in the art to form a pattern of openings that leave selected portions of the substrate's back surface exposed. The pattern of openings can take any shape or design that meets the needs of the device. For example, the pattern can be a series of parallel rows and/or parallel columns, cross-hatched lines, concentric or non-concentric circles, and/or a combination of various shapes. The pattern can be uniform, non-uniform, and/or include discrete and separate patterns. The exposed back surface portions of the substrate 10 are etched by anisotropic dry etch or other appropriate etch, to form trenches 26 (i.e. cooling channels) into the back surface of the substrate 10. The silicon etching can be performed using CF4, SF6, NF3, Cl2, CCl2F2 or any other appropriate etchant. A preferred depth of the trenches is in range of 5% to 50% of the overall thickness of substrate. The trenches 26 can have vertical sidewalls or tapered sidewalls. The preferred angle of the trench sidewalls is in the range of 30 degrees to 90 degrees relative to the substrate's back surface. FIG. 2C shows the resulting structure (with tapered trench sidewalls).

After the photoresist is removed (e.g. using sulphuric acid, acetone, oxide plasma or any other photoresist stripping method that are well known in the art), an optional layer 28 of high thermal conductive material and diffusion barrier material can be formed on the back surface of substrate 10. This layer can be formed as a plurality of sub-layers. For example, one preferable layer 28 can be formed of the following sub layers formed on the substrate's back surface in the following order: silicon nitride, titanium and copper. These sub layers can be deposited by physical vapor deposition (PVD). The material composition of the layer 28 is not limited to the aforementioned example. The protective layer 22 is selectively patterned (e.g. using a laser or a photo lithography process) to remove portions thereof to expose areas of the substrate's front surface between the active areas of sensors 12 (including exposing the contact pads 18). The resulting structure is shown in FIG. 2D.

A layer of photoresist 30 is deposited over the protective layer 22 and exposed portions of the substrate's front surface (i.e. the active side at or on which the sensor components are formed). The photoresist 30 is exposed and selectively etched to leave portions of the substrate's front surface exposed (portions between the contact pads 18 of adjacent sensors 12). The exposed portions of the substrate's front surface are then etched and removed (e.g. by anisotropic dry etch) to form second trenches 32 into the front surface of the substrate 10. The etch can use CF4, SF6, NF3, Cl2, CCl2F2 etchants, or any other appropriate etchant. Preferred depth of the second trenches 32 is in range of 5% to 50% of the thickness of substrate 10. The resulting structure is shown in FIG. 2E.

After the photoresist 30 is removed, a passivation layer 34 (e.g. silicon dioxide, silicon nitride, etc.) is deposited over the front surface of the substrate 10 (including over protective layer 22 thereon). Preferably, the passivation layer 34 is made of silicon nitride (e.g. at least 0.1 μm) and dioxide (e.g. at least 0.5 μm) using a PECVD (Plasma Enhanced Chemical Vapor Deposition) deposition method or any another appropriate deposition method(s). A layer of photoresist 36 is deposited over the passivation layer 34. The photoresist 36 is exposed and selectively etched using appropriate photolithography processing to leave those portions of the passivation layer 34 over the contact pads 18 exposed. The exposed portions of the passivation layer 34 are then removed (e.g. by plasma etching) to expose the contact pads 18. If passivation is silicon dioxide, then the etchant can be CF4, SF6, NF3 or any other appropriate etchant. If passivation is silicon nitride, then etchant can be CF4, SF6, NF3, CHF3 or any other appropriate etchant. The resulting structure is shown in FIG. 2F After photoresist 36 removed, a layer of electrically conductive material is deposited over the passivation layer 34, such as titanium, copper, aluminum, conductive polymer or any other appropriate electrically conductive material(s). The conductive layer can be single or multilayer and can be deposited by Physical Vapor Deposition (PVD), Chemical Vapor Deposition (CVD), plating or any other appropriate deposition method(s). Preferably, the electrically conductive material is aluminum and is deposited by sputtering. A layer of photoresist 40 is deposited over the conductive layer and selectively exposed/etched using appropriate photolithography processing to remove those portions of the photo resist over the active areas of sensors 12 and the center of the second trenches 32. The cured/hardened photoresist 40 forms the mask for those portions of the conductive layer extending from the contact pads 18 down into the second trenches 32. Dry plasma or wet etching method(s) are used to remove the exposed portions of the conductive layer, leaving a plurality of discrete traces (leads) 38 of the conductive material. Each of the discrete traces (leads) 38 extends from one of the contact pads 18 to the bottom of one of the second trenches 32. Etchant for the wet etch can be phosphoric acid (H3PO4), acetic acid, nitric acid (HNO3) or any other appropriate etchant(s). Etchant for the dry etch can be Cl2, CCl4, SiCl4, BCl3 or any other appropriate etchant(s). A wet etch is the preferred method for lead formation. The resulting structure is shown in FIG. 2G.

Figure 2H:
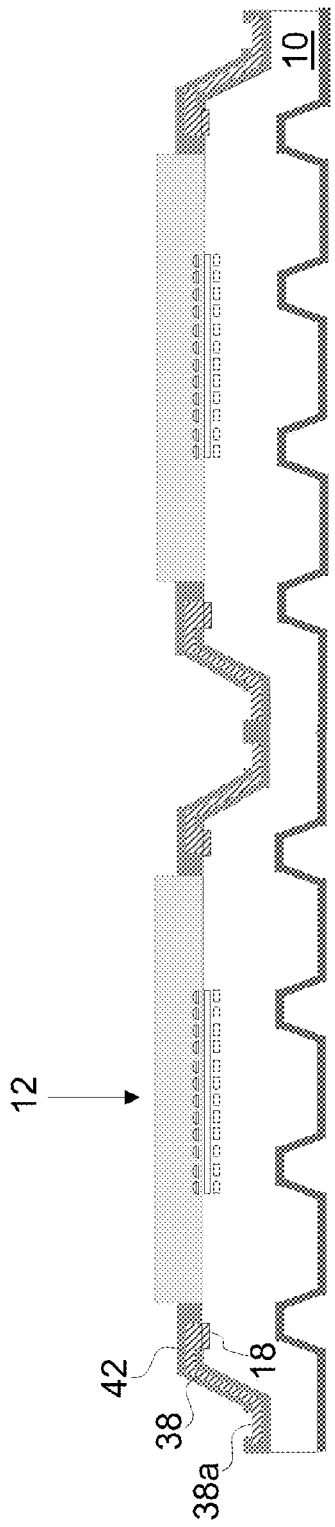

After photoresist 40 is removed, an optional plating process can be performed to plate the leads 38 with additional conductive material(s) (e.g. Ni/Pd/Au). An encapsulant layer 42 is deposited over the structure (including over the conductive leads 38). The encapsulant layer can be polyimide, ceramics, polymer, polymer composite, parylene, metallic oxide, silicon dioxide, epoxy, silicone, porcelain, nitrides, glass, ionic crystals, resin, and a combination of aforementioned materials or any other appropriate dielectric material(s). The encapsulant layer is preferably 0.1 to 3 μm in thickness, and the preferred material is a liquid photolithography polymer such as solder mask which can be deposited by spray coating. The photolithography polymer encapsulant 42 is subjected to a photolithography and etch process that removes the portions of the encapsulation layer 42 over the active areas of sensors 12 and the rerouted contact areas 38a of each lead 38 at the bottom of second trenches 32. If the encapsulant is made of a non-photolithography material such as silicon dioxide, then a separate photoresist deposition, lithography and etch process can be used to achieve the same result. The resulting structure is shown in FIG. 2H.

A layer of bonding agent 44 is deposited on the back surface of the substrate 10, as shown in FIG. 2I. The bonding agent 44 can be re-activated during surface mounting process. A bonding agent material with high thermal conductivity properties is preferable (e.g. can be a mix of polymer and silver or tin). Alternatively, a Ball Grid Array (BGA) can be applied to the back surface of substrate 10 using techniques that are well known in the art, as shown in FIG. 2J. Both BGA and the bonding agent can be selectively applied through screen printing or using a dispenser.

Figure 2K:
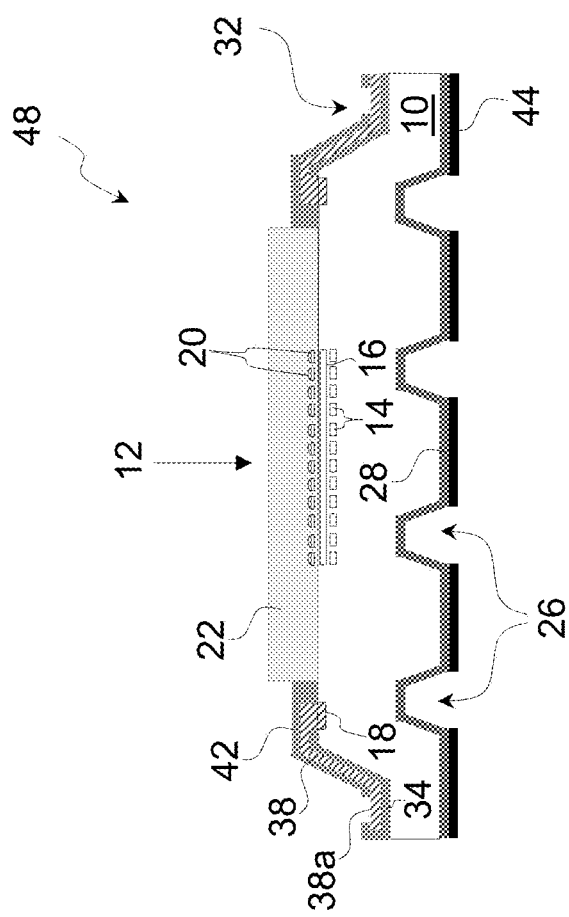

The substrate 10 is then diced/singulated along lines between the image sensors 12 and their associated contact pads 18 (i.e. along second trenches 32) by, for example, mechanical blade dicing equipment, laser cutting or any other appropriate processes, to separate the substrate 10 into individual packaged image sensor dies 48 (i.e. each with an image sensor 12), as shown in FIG. 2K (in the case of using bonding agent 44). Contact pads 18 are re-routed down into second trenches 32 by leads 38 to lead contact areas 38a. For the singulated die 48, second trenches 32 could be multiple discrete trenches, or could be a single trench that in essence forms a shoulder having a surface for lead contact areas 38a that is recessed below the substrate's front surface. Trenches 26 form cooling channels that convey heat from substrate 10 (i.e. by expanding the surface area of the back surface of substrate 10, and forming channels through which heat can be conveyed even when the bottom surface is mounted to a host surface).

Figure 3A:
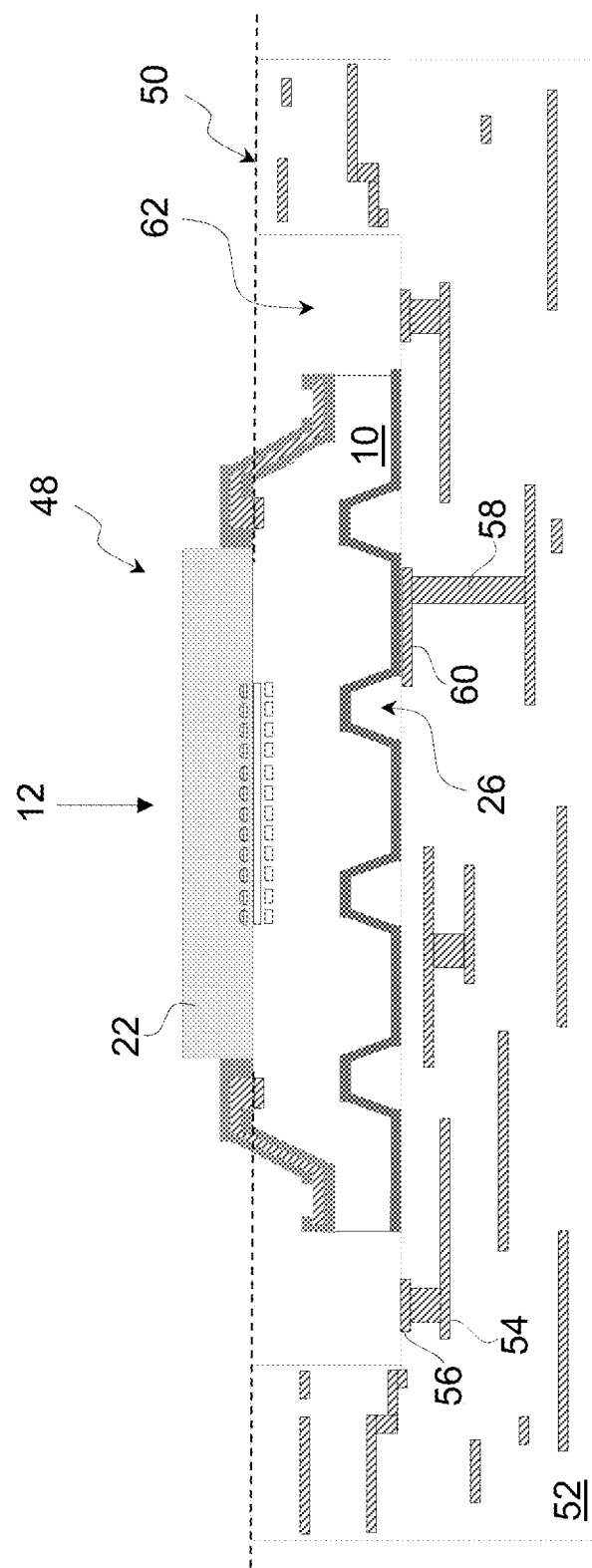
FIGS. 3A-3B are side cross sectional views showing the steps of integrating the image sensor die in a PCB.
Figure 3B:
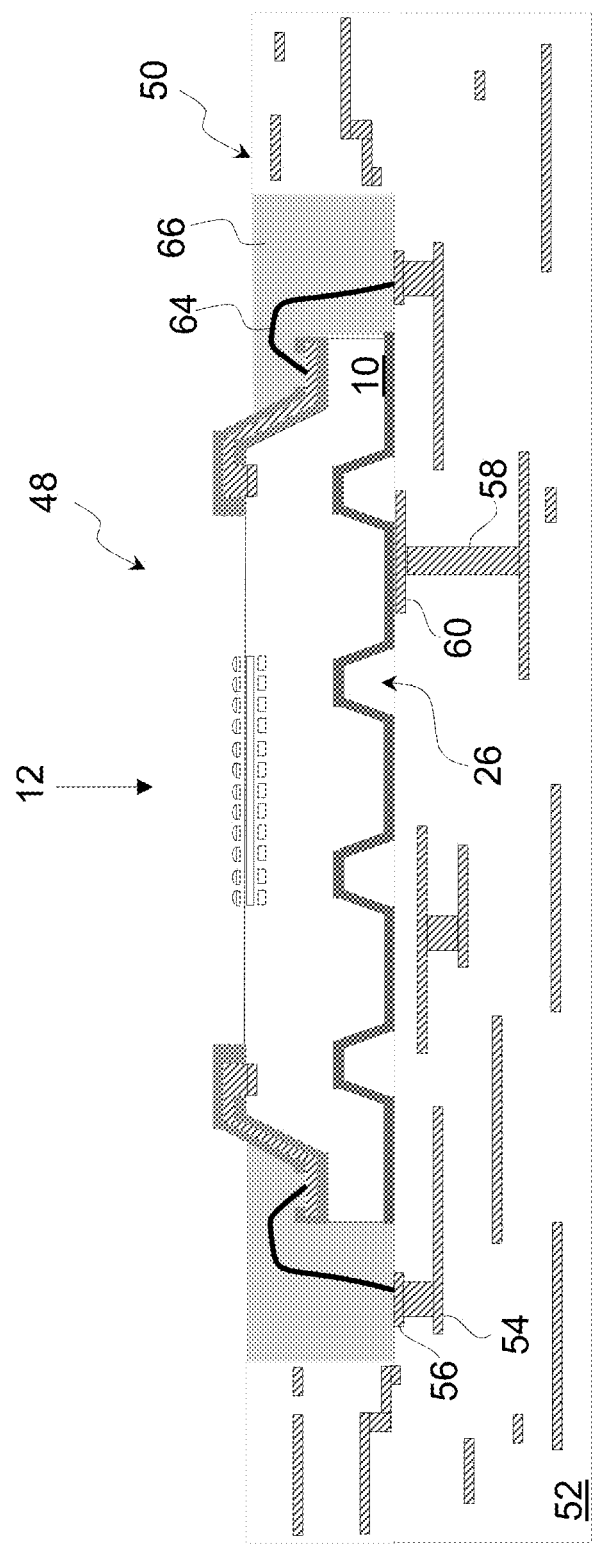

FIGS. 3A-3B illustrate the integration of the image sensor die package 48 with a PCB 50 (flex or rigid). The PCB 50 includes a flexible or semi-rigid or rigid substrate 52 containing electrical traces 54 terminating in bond pads 56 at its upper surface. The substrate's upper surface includes a cavity 62 formed therein (i.e. the upper surface has a recessed portion that defines cavity 62). Cavity 62 can also be used as the host for the image sensor die 48. The depth of cavity 62 is preferably at least equal to the height of the image sensor die 48 up to the front surface of substrate 10, as shown by the dashed line in FIG. 3A. The PCB bond pads 56 are preferably positioned inside the cavity 62. Optional heat conducting pads 60 can be located on the cavity surface to make contact with the back surface of substrate 10 and/or any thermal conductive material formed thereon. The heat conductive pads 60 are preferably connected to heat conductive leads 58 (or a network of such leads) that extend throughout the PCB substrate 52 which will act as a heat radiator. The heat conductive pads 60 can also be used as bonding pads that serve to attach the image sensor die package 48 to the host PCB 50. An optional adhesive layer with high thermal conductivity can be applied to the cavity 62 for bonding purposes.

Bond wires 64 are used to connect the sensor's rerouted contacts 38a to the PCB bond pads 56. An overmold compound 66 is injected into the cavity 62. The overmold material 66 can be epoxy, polymer, resins or any other protective dielectric material(s) that are well-known in the art. The cured overmold material 66 preferably fills the outer perimeter of the cavity 62 so that the upper surface of overmold material 66 is level or nearly level with the upper surface of PCB substrate 52. The overmold material 66 is preferably selectively dispensed into the cavity 62 such that an inner portion of the cavity 62 is not filled (i.e. the cooling channels 26 are left unfilled and unburied). The protective layer 22 is then removed, thus exposing the active area of sensor 12 to the environment. The final resulting structure is shown in FIG. 3B.

The PCB 50 provides mechanical support and protection, along with electrical and thermal conductivity, for the image sensor die 48, in a compact design. Heat is conveyed away from the image sensor die 48 by thermal conduction through heat conducting pads and leads 60/58, and by air conduction through trenches (cooling channels) 26. The image sensor die 48 provides a low profile cooling solution. The cooling channels 26 formed on the backside of the sensor chip substrate 10 increases increase the heat dissipation surface area and therefore increases the heat dissipation rate while not adding to the height of the structure. The sensor's contact pads 18 are rerouted by leads 38 down to a lower level. The bond wires 64 connect the rerouted contact pads to the host bond pads 56 in a manner where the bond wires 64 are tucked away inside cavity 62 thus reducing the package height. By mounting the image sensor die at least partially in the cavity 62 of PCB 50, overall height is reduced further.

Figure 4:
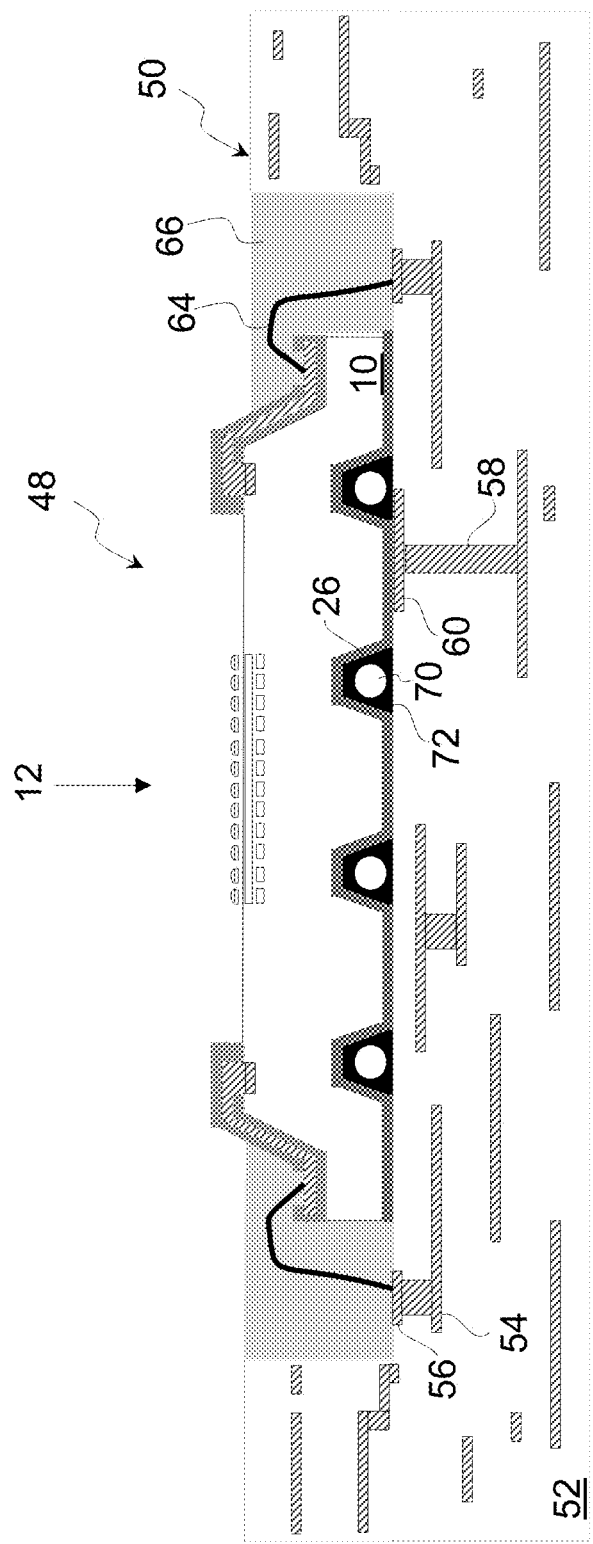
FIG. 4 is a side cross sectional view showing an integrated image sensor die and PCB utilizing heat pipes.

FIG. 4 illustrates a first alternate embodiment, which additionally includes heat pipes 70 that extend in the cooling channels 26. The heat pipes 70 can be solid metallic rods, or hollowed rods containing a gas, a liquid, or both. The heat pipes 70 residing in the cooling channels 26 are preferably covered in a heat conducting material 72 such as a metallic paste for enhanced thermal conduction between the heat pipes 70 and the substrate 10. An external radiator or a pump, or both, can be connected to the heat pipes 70. The heat pipes 70 can be mounted to the PCB substrate 52 with solder or adhesives, and then the image sensor die 48 can be bonded over the heat pipes 70.

Figure 5:
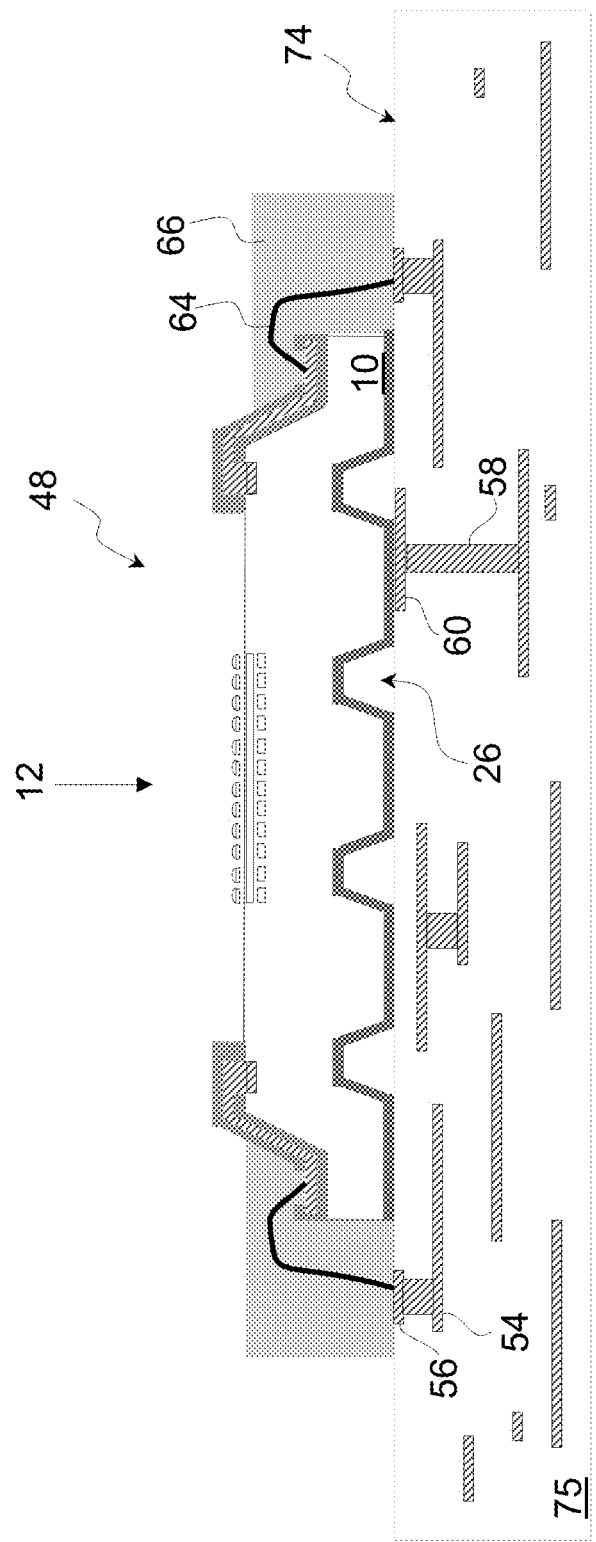
FIG. 5 is a side cross sectional view showing an integrated image sensor die and PCB.

FIG. 5 illustrates a second alternate embodiment, which uses a PCB host 74 instead of the PCB 50 previously described. The configuration is the same as that for the PCB 50, except there is no cavity formed in the upper surface of the PCB host 74.

Figure 6:
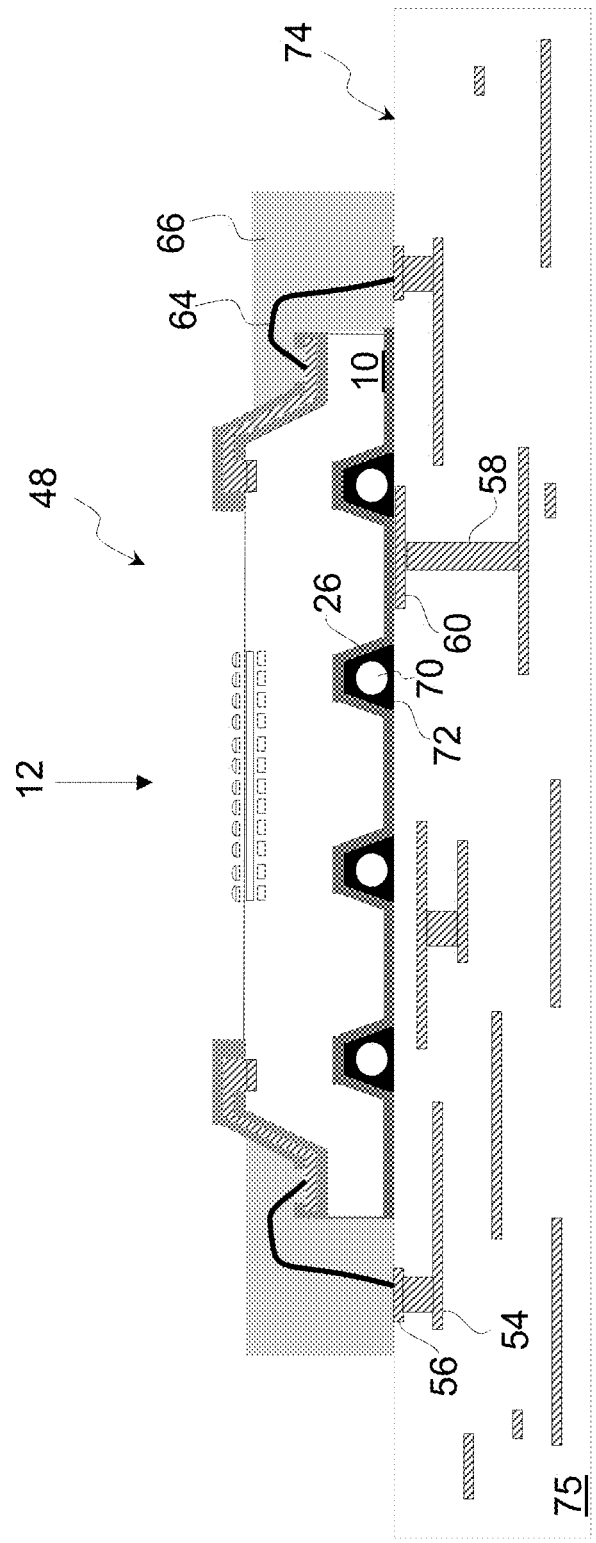
FIG. 6 is a side cross sectional view showing an integrated image sensor die and PCB utilizing heat pipes.

FIG. 6 illustrates a third alternate embodiment, in which heat pipes 70 are added to the cooling channels 26 of the PCB 74 of FIG. 5.

Figure 7:
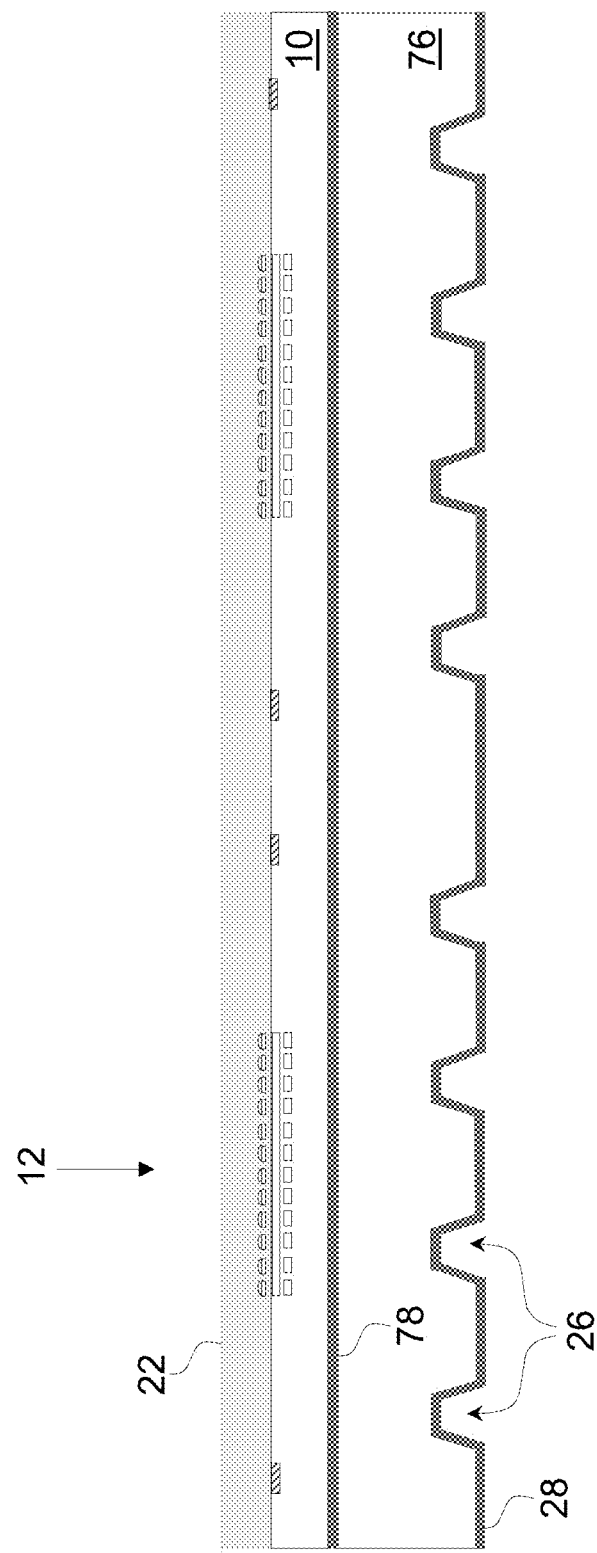
FIG. 7 is a side cross section view showing the cooling channels formed in a separate cooling module that is attached to the image sensor substrate.

FIG. 7 illustrates a fourth alternate embodiment, in which the above described cooling features are formed in a separate cooling module 76 that attaches to the image sensor substrate 10 (as opposed to be being formed integrally in substrate 10). The cooling module 76 is a separate substrate that can be made of metallic or crystalline silicon material, and can be processed as described above with respect to FIGS. 2C and 2D to form the cooling channels 26 in its bottom surface. The cooling module 76 is attached to the bottom of substrate 10 with a solder paste or any other high thermal transfer bonding agent 78. The structure is then processed as described above with respect to FIGS. 2E-2I to complete the image sensor die 48, and then mounted to the PCB as shown in FIG. 3B, 4, 5 or 6.

Figure 8:
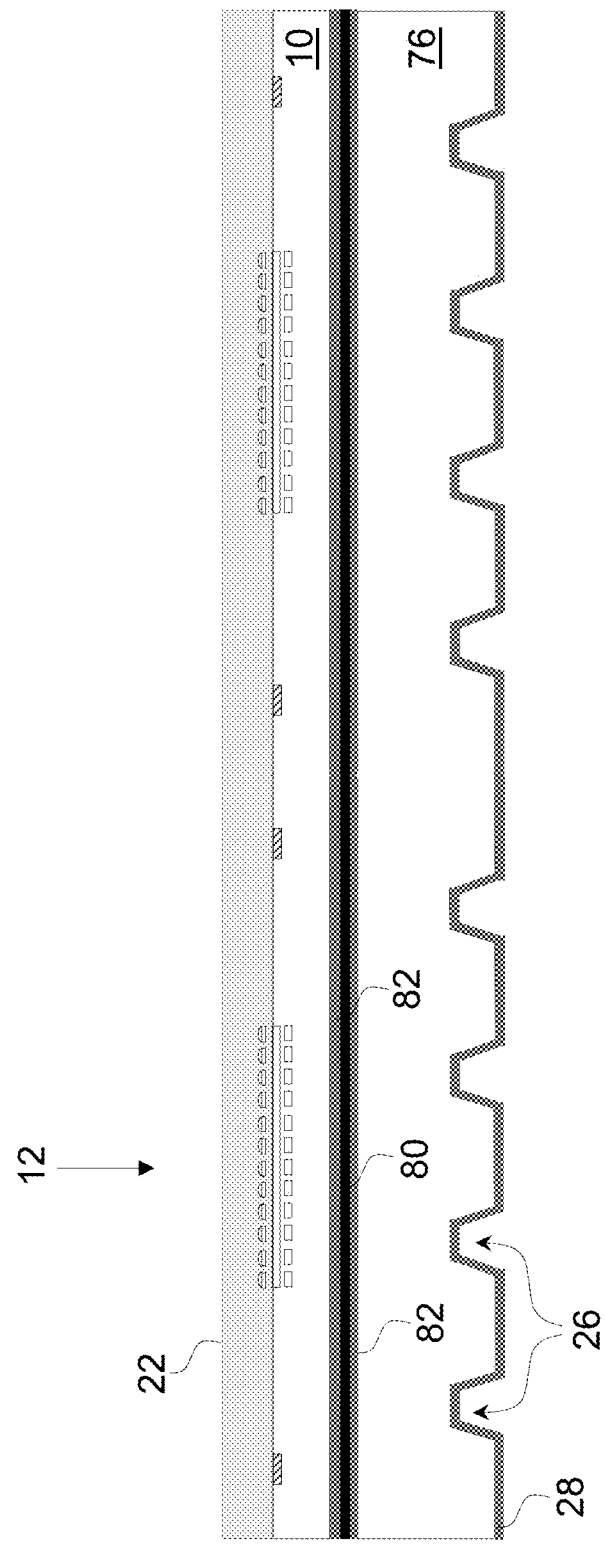
FIG. 8 is a side cross section view showing the cooling channels formed in a separate cooling module that is attached to the image sensor substrate by a thermal electric heat pump.

FIG. 8 illustrates a fifth alternate embodiment, in which the above described cooling module 76 is attached to the substrate 10 by a thermal electric heat pump 80 (also known as a Peltier cooler or a TEC-thermal electric cooler). Adhesive layers 82 (e.g. high thermal transfer bonding agent) are used to attach thermal electric heat pump 80 to the substrate 10 and cooling module 76. The thermal electric pump 80 transfers heat from substrate 10 to cooling module 76 through the consumption of electrical energy. The orientation of the thermal electric heat pump 80 could be reversed (i.e. flipped over) to turn it into a thermal electric generator. The structure is then processed as described above with respect to FIGS. 2E-2I to complete the image sensor die 48, and then mounted to the PCB as shown in FIG. 3B, 4, 5 or 6.

Figure 9:
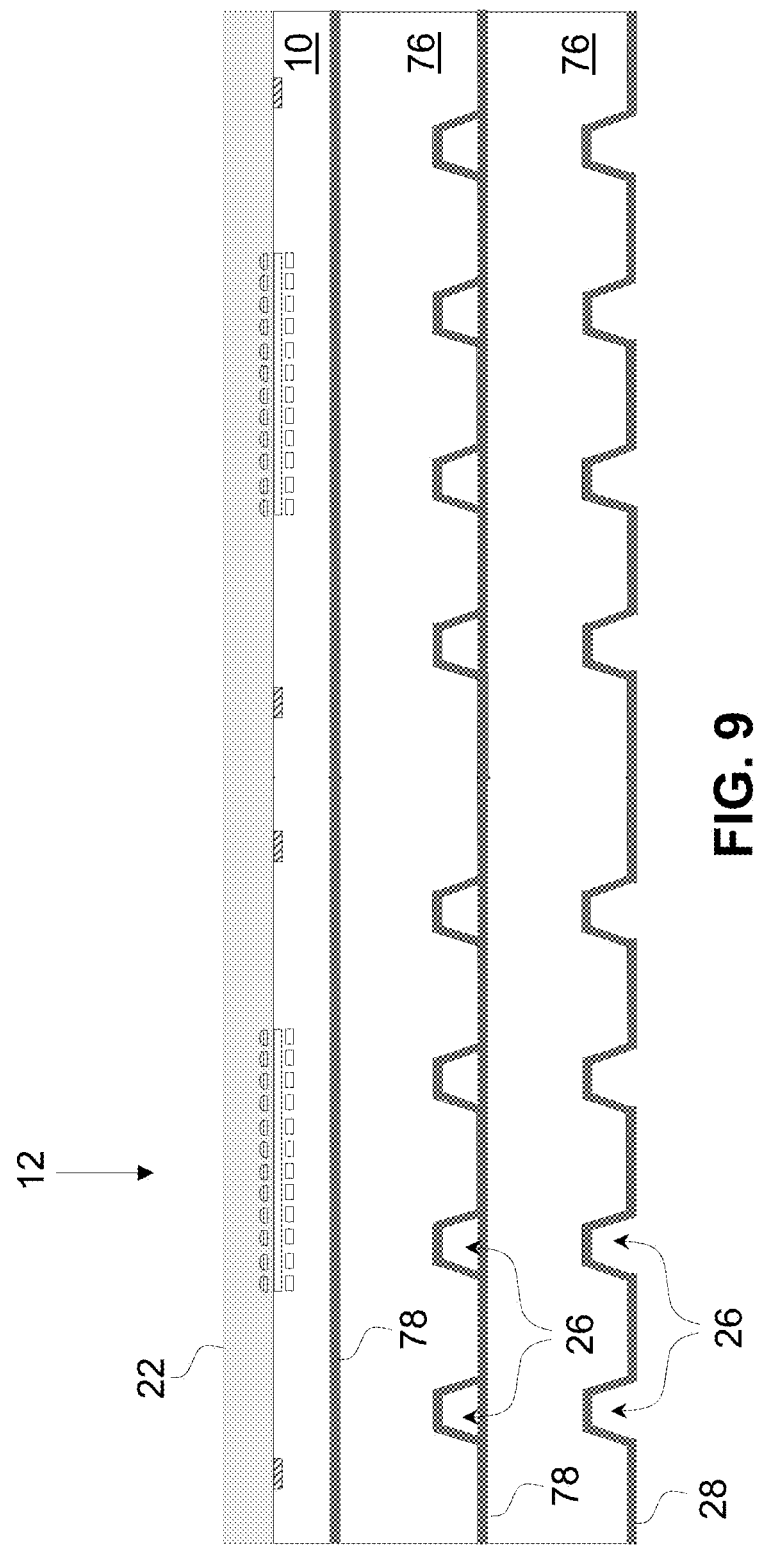
FIG. 9 is a side cross section view showing the cooling channels formed in plural separate cooling modules that are attached to the image sensor substrate.

FIG. 9 illustrates a sixth alternate embodiment, in which a plurality of the cooling modules 76 described above are attached to the substrate 10 (i.e. one cooling module 76 is attached to the substrate 10, and a second cooling module 76 is attached to the first cooling module 76. While FIG. 9 shows two cooling modules 76, more than two cooling modules 76 can be stacked in this manner. The structure is then processed as described above with respect to FIGS. 2E-2I to complete the image sensor die 48, and then mounted to the PCB as shown in FIG. 3B, 4, 5 or 6.

Figure 10:
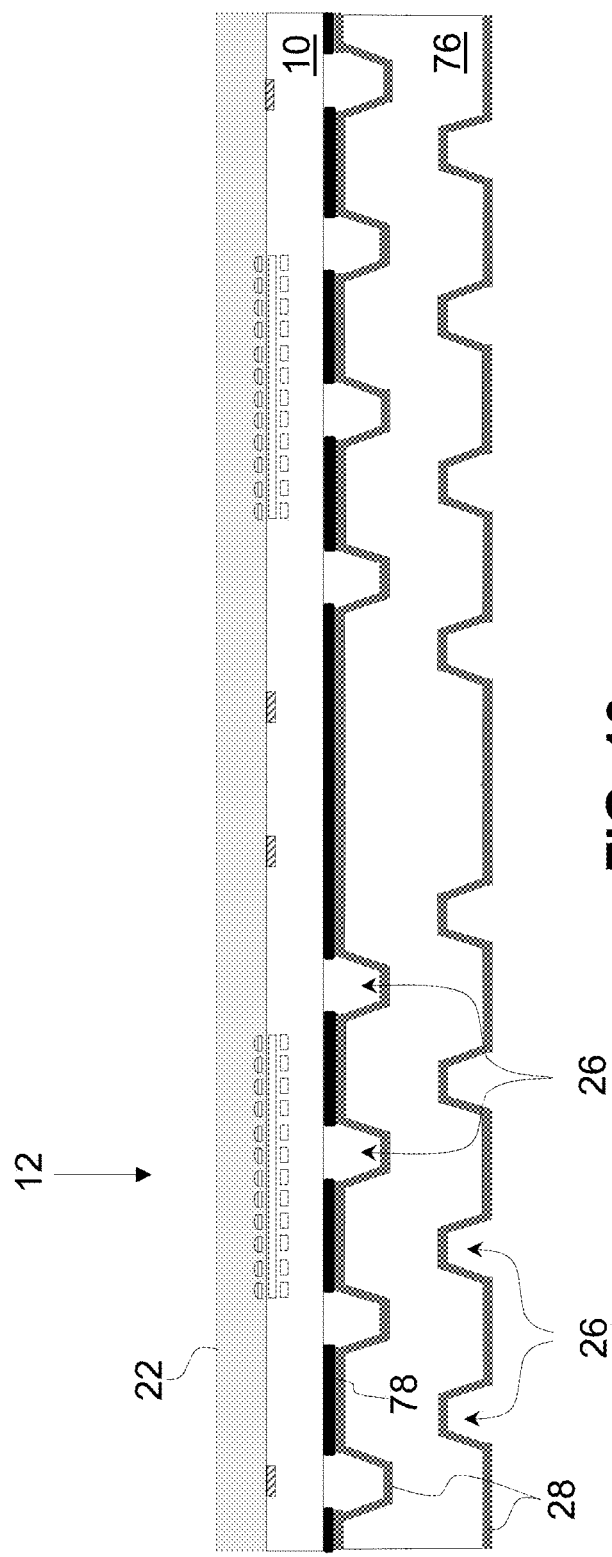
FIG. 10 is a side cross section view showing the cooling channels formed in both the top and bottom surfaces of a separate cooling module that is attached to the image sensor substrate.

FIG. 10 illustrates a seventh alternate embodiment, which is similar to the embodiment of FIG. 7, except the cooling channels 26 are formed on both the top and bottom surfaces of the cooling module for additional cooling capacity. The structure is then processed as described above with respect to FIGS. 2E-2I to complete the image sensor die 48, and then mounted to the PCB as shown in FIG. 3B, 4, 5 or 6.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the packaged semiconductor device. Single layers of material could be formed as multiple layers of such or similar materials, and vice versa. Finally, the orientation of elements can be reversed. For example, the cooling channels 26 can be formed on the top surface(s) of cooling module(s) 76 in FIGS. 7 and 9 instead of on the bottom surface(s) as shown).

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A sensor device, comprising:
    a silicon substrate with opposing first and second surfaces;
    a sensor formed at or in the first surface;
    a plurality of first contact pads formed at the first surface which are electrically coupled to the sensor;
    a plurality of cooling channels formed as first trenches extending into the second surface but not reaching the first surface;
    a second substrate with opposing first and second surfaces, wherein the second surface of the silicon substrate is mounted to the first surface of the second substrate;
    a plurality of second contact pads disposed at the first surface of the second substrate;
    a plurality of electrical leads extending through the second substrate and electrically coupled to the plurality of second contact pads; and
    a plurality of wires each extending from one of the first contact pads to one of the second contact pads.

2. The device of claim 1, further comprising:
    a thermally conductive material disposed between the second surface of the silicon substrate and the first surface of the second substrate.

3. The device of claim 1, further comprising:
    a plurality of heat conducting pads disposed at the first surface of the second substrate; and
    a plurality of heat conducting leads extending through the second substrate and coupled to the plurality of heat conducting pads.

4. The device of claim 1, further comprising:
    a portion of the first surface of the second substrate is recessed to define a cavity, wherein the silicon substrate is at least partially disposed in the cavity.

5. The device of claim 4, wherein the plurality of second contact pads is disposed at the recessed portion of the first surface of the second substrate, and wherein the wires are disposed in the cavity.

6. A sensor device, comprising:
    a silicon substrate with opposing first and second surfaces;
    a sensor formed at or in the first surface;
    a plurality of first contact pads formed at the first surface which are electrically coupled to the sensor;
    a second substrate with opposing first and second surfaces, wherein the second surface of the silicon substrate is mounted to the first surface of the second substrate by a thermally conductive material continuously disposed between the second surface of the silicon substrate and the first surface of the second substrate; and
    a plurality of cooling channels formed as first trenches extending into one of the first and second surfaces of the second substrate but not reaching the other of the first and second surfaces of the second substrate.

7. The device of claim 6, further comprising:
    a thermal electric heat pump disposed between the second surface of the silicon substrate and the first surface of the second substrate.

8. The device of claim 6, further comprising:
    one or more heat pipes disposed in the cooling channels.

9. A sensor device, comprising:
    a silicon substrate with opposing first and second surfaces;
    a sensor formed at or in the first surface;
    a plurality of first contact pads formed at the first surface which are electrically coupled to the sensor;
    a second substrate with opposing first and second surfaces, wherein the second surface of the silicon substrate is mounted to the first surface of the second substrate;

a plurality of cooling channels formed as first trenches extending into one of the first and second surfaces of the second substrate but not reaching the other of the first and second surfaces of the second substrate; and a second plurality of cooling channels formed as second trenches extending into the other of the first and second surfaces of the second substrate.

10. A sensor device, comprising:

a silicon substrate with opposing first and second surfaces;

a sensor formed at or in the first surface;

a plurality of first contact pads formed at the first surface which are electrically coupled to the sensor;

a second substrate with opposing first and second surfaces, wherein the second surface of the silicon substrate is mounted to the first surface of the second substrate;

a plurality of cooling channels formed as first trenches extending into one of the first and second surfaces of the second substrate but not reaching the other of the first and second surfaces of the second substrate;

a third substrate with opposing first and second surfaces, wherein the second surface of the second substrate is mounted to the first surface of the third substrate; and a second plurality of cooling channels formed as second trenches extending into one of the first and second surfaces of the third substrate but not reaching the other of the first and second surfaces of the third substrate.

11. A sensor device, comprising:

a silicon substrate with opposing first and second surfaces;

a sensor formed at or in the first surface;

a plurality of first contact pads formed at the first surface which are electrically coupled to the sensor;

a second substrate with opposing first and second surfaces, wherein the second surface of the silicon substrate is mounted to the first surface of the second substrate;

a plurality of cooling channels formed as first trenches extending into one of the first and second surfaces of the second substrate but not reaching the other of the first and second surfaces of the second substrate;

a third substrate with opposing first and second surfaces, wherein the second surface of the second substrate is mounted to the first surface of the third substrate;

a plurality of second contact pads disposed at the first surface of the third substrate;

a plurality of electrical leads extending through the third substrate and electrically coupled to the plurality of second contact pads; and a plurality of wires each extending from one of the first contact pads to one of the second contact pads.

12. The device of claim 11, further comprising:

a portion of the first surface of the third substrate is recessed to define a cavity, wherein the silicon substrate is at least partially disposed in the cavity.

* * * * *